(12) United States Patent
Darsillo et al.

(10) Patent No.: US 7,736,405 B2
(45) Date of Patent: Jun. 15, 2010

(54) CHEMICAL MECHANICAL POLISHING COMPOSITIONS FOR COPPER AND ASSOCIATED MATERIALS AND METHOD OF USING SAME

(75) Inventors: Michael Darsillo, Woodbury, CT (US); Peter Wrschka, Danbury, CT (US); Karl Boggs, Hopewell Jct., NY (US)

(73) Assignee: Advanced Technology Materials, Inc., Danbury, CT (US)

( * ) Notice: Subject to any disclaimer, the term of this patent is extended or adjusted under 35 U.S.C. 154(b) by 206 days.

(21) Appl. No.: 10/436,381

(22) Filed: May 12, 2003

(65) Prior Publication Data
US 2004/0229461 A1 Nov. 18, 2004

(51) Int. Cl.
C09G 1/02 (2006.01)
C09G 1/04 (2006.01)
C11D 7/60 (2006.01)
H01L 21/461 (2006.01)
C25F 3/00 (2006.01)

(52) U.S. Cl. ............................... 51/307; 51/309; 106/3; 106/5; 438/692; 438/693; 216/105; 216/106

(58) Field of Classification Search .................... 51/307, 51/308, 309, 208; 106/3, 5; 438/692, 693; 216/105, 106
See application file for complete search history.

(56) References Cited

U.S. PATENT DOCUMENTS

| | | | |
|---|---|---|---|
| 5,266,088 A * | 11/1993 | Sandusky et al. | 51/298 |
| 6,039,891 A * | 3/2000 | Kaufman et al. | 252/79.1 |
| 6,184,141 B1 | 2/2001 | Avanzino et al. | |
| 6,190,237 B1 | 2/2001 | Huynh et al. | |
| 6,312,486 B1 | 11/2001 | Sandhu et al. | |
| 6,428,721 B1 | 8/2002 | Ina et al. | |
| 6,429,134 B1 | 8/2002 | Kubota et al. | |
| 6,440,186 B1 | 8/2002 | Sakai et al. | |
| 6,447,695 B1 | 9/2002 | Motonari et al. | |
| 6,468,910 B1 | 10/2002 | Srinivasan et al. | |
| 6,491,843 B1 | 12/2002 | Srinivasan et al. | |
| 6,530,968 B2 | 3/2003 | Tsuchiya et al. | |
| 6,544,892 B2 | 4/2003 | Srinivasan et al. | |
| 6,561,883 B1 * | 5/2003 | Kondo et al. | 451/63 |
| 6,568,996 B2 * | 5/2003 | Kobayashi et al. | 451/36 |
| 6,638,854 B2 | 10/2003 | Homma et al. | |
| 6,656,842 B2 | 12/2003 | Li et al. | |
| 6,685,757 B2 * | 2/2004 | Xu et al. | 51/308 |
| 6,692,546 B2 * | 2/2004 | Ma et al. | 51/298 |
| 6,805,812 B2 | 10/2004 | Fang | |
| 6,830,503 B1 * | 12/2004 | Grumbine | 451/41 |
| 6,936,543 B2 | 8/2005 | Schroeder et al. | |
| 6,976,905 B1 | 12/2005 | Fang et al. | |
| 2001/0003672 A1 * | 6/2001 | Inoue et al. | 438/690 |
| 2001/0008828 A1 * | 7/2001 | Uchikura et al. | 451/41 |
| 2002/0005017 A1 | 1/2002 | Motonari et al. | |
| 2002/0016073 A1 | 2/2002 | Kondo et al. | |
| 2002/0095872 A1 * | 7/2002 | Tsuchiya et al. | 51/307 |
| 2003/0006397 A1 | 1/2003 | Srinivasan et al. | |
| 2003/0047710 A1 | 3/2003 | Babu et al. | |
| 2003/0073386 A1 * | 4/2003 | Ma et al. | 451/41 |
| 2003/0087525 A1 * | 5/2003 | Sinha et al. | 438/691 |
| 2003/0100247 A1 | 5/2003 | Kim et al. | |
| 2004/0108302 A1 * | 6/2004 | Liu et al. | 216/83 |
| 2006/0042502 A1 * | 3/2006 | Sato et al. | 106/10 |

FOREIGN PATENT DOCUMENTS

| | | |
|---|---|---|
| EP | 1081200 | 3/2001 |
| EP | 1138733 | 10/2001 |
| EP | 1138734 | 10/2001 |
| WO | WO 02/33736 | 4/2002 |

OTHER PUBLICATIONS

"Hydroxyl Radical Formation in H2O2-Amino Acid Mixtures and Chemical Mechanical Polishing of Copper", M. Hariharputhiran, et al., Journal of The Electrochemical Society, 147 (10) 3820-3826 (2000).

Brookfiled Engineering Labs., Inc., More Solutions to Sticky Problems, p. 13, chapter 4, section 4.1, "Coming to Grips with Rheology".

"Rheology Modification of Hydrogen Peroxide-Based Applications Using Cross-Linked Polyacrylic Acid Polymers", Society of Cosmetics Chemists, Dec. 1997, New York, July Schmucker-Castner and Dilip Desai.

"Rheology Modification of Hydrogen Peroxide-Based Applications Using Cross-Linked Polyacrylic Acid Polymers", Society of Cosmetics Chemists, Dec. 1997, New York, Julie Schmucker-Castner and Dilip Desai, The BFGoodrich Company, p. 1-11.

Supplementary European Search Report for EP 03 81 2786, Nov. 30, 2005.

Aksu et al., "The Role of Glycine in the Chemical Mechanical Planarization of Copper," Journal of the Electrochemical Society, vol. 149, No. 6, (2002), pp. G352-G361.

* cited by examiner

*Primary Examiner*—Jerry Lorengo
*Assistant Examiner*—Shuangyi Abu Ali
(74) *Attorney, Agent, or Firm*—Chih-Sheng (Jason) Lin; Tristan A. Fuierer; Moore & Van Allen, PLLC

(57) ABSTRACT

A CMP composition containing a rheology agent, e.g., in combination with oxidizing agent, chelating agent, inhibiting agent, abrasive and solvent. Such CMP composition advantageously increases the materials selectivity in the CMP process and is useful for polishing surfaces of copper elements on semiconductor substrates, without the occurrence of dishing or other adverse planarization deficiencies in the polished copper.

40 Claims, 6 Drawing Sheets

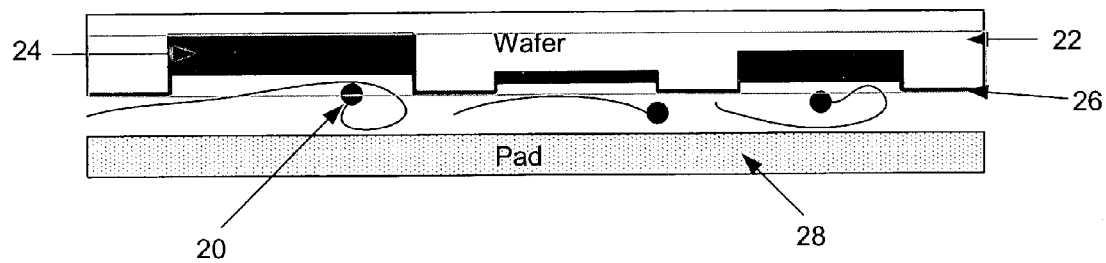
Figure 2a
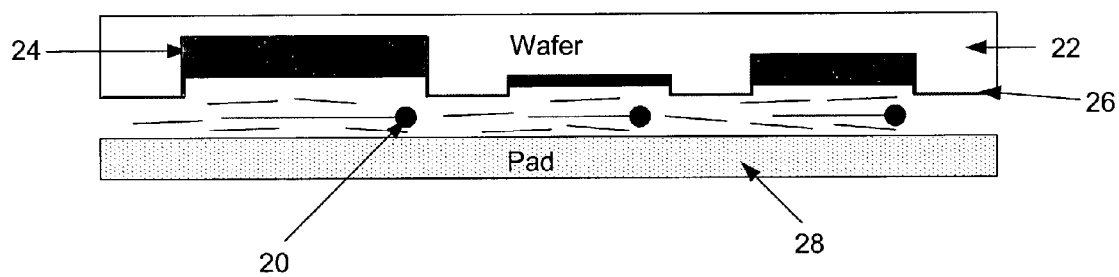
Figure 2b
Figure 2

CHEMICAL MECHANICAL POLISHING COMPOSITIONS FOR COPPER AND ASSOCIATED MATERIALS AND METHOD OF USING SAME

FIELD OF THE INVENTION

The present invention relates to a chemical mechanical polishing composition and to a method of using same for the polishing of semiconductor substrates having copper thereon, e.g., copper interconnects, electrodes, or metallization, as part of a semiconductor device structure on a wafer substrate.

DESCRIPTION OF THE RELATED ART

Copper is employed in semiconductor manufacturing as a material of construction for components of semiconductor device structures on wafer substrates (e.g., contacts, electrodes, conductive vias, field emitter base layers, etc.), and it is rapidly becoming the interconnect metal of choice in semiconductor manufacturing due to its higher conductivity and increased electromigration resistance relative to aluminum and aluminum alloys.

Typically, the process scheme for utilizing copper in semiconductor manufacturing involves the damascene approach, wherein features are etched in a dielectric material. In the dual damascene process a single fill is used to form both plugs and lines. Since copper has a propensity to diffuse into the dielectric material, leading to leakage between metal lines, barrier/liner layers, such as Ta or TaN deposited by various deposition methods, are often used to seal the copper interconnects. Following deposition of the liner layer material, a thin seed layer of copper is deposited on the liner material via physical or chemical vapor deposition, followed by electrodeposition of copper to fill the features.

As copper is deposited to fill the etched features, elevational disparity or topography develops across the surface of the layer, having raised and recessed regions. The deposited copper overburden must then be removed to render it of suitable form to accommodate subsequent process steps in the fabrication of the finished semiconductor product, and in order to satisfactorily operate in the micro-circuitry in which it is present. The planarization typically involves chemical mechanical polishing (CMP), using a CMP composition formulated for such purpose.

Chemical Mechanical Polishing or Planarization ("CMP") is a process in which material is removed from a surface of a semiconductor wafer, and the surface is polished (planarized) by coupling a physical process such as abrasion with a chemical process such as oxidation or chelation. In its most rudimentary form, CMP involves applying slurry, a solution of an abrasive and an active chemistry, to a wafer surface or polishing pad that buffs the surface of the semiconductor wafer to achieve the removal, planarization, and polishing process.

Due to the difference in chemical reactivity between copper and the liner layer, e.g. Ta or TaN, two chemically distinct slurries are often used in the copper CMP process. The first step slurry (Step I) is typically used to rapidly planarize the topography and to uniformly remove the remaining copper, with the polish stopping at the liner layer. The second step slurry (Step II) typically removes the liner (barrier) layer material at a high removal rate and stops on the dielectric layer, or alternatively on a cap layer that has been applied to protect the dielectric. Typical Step 1 slurries have a high copper removal rate, and a copper to liner material removal rate selectivity of greater than 4:1.

At the point at which copper is removed to expose the underlying liner material between features the slurry requirements rapidly change. However, until the copper layer is removed between features, as would be indicated by an endpoint detection system, the copper polishing continues until all copper overburden is removed between feature patterns. The period of time from liner exposure to the end of the polishing step is referred to as over-polish, during which time, dishing into copper features occurs and wafer surface planarity is lost.

Dishing occurs when too much copper is removed such that the copper surface is recessed relative to the liner and/or dielectric surface of the semiconductor wafer. Dishing occurs when the copper and liner material removal rates are disparate. Oxide erosion occurs when too much dielectric material is removed. Dishing and oxide erosion are dependent on area, pattern and pitch.

Using a polishing formulation having the appropriate selectivity for the material(s) to be removed is one key to obtaining uniform planarization across the wafer surface. Uniform distribution of abrasive and pad mechanical force are further keys to obtaining good planarity.

Of concern to commercial CMP slurries is that the abrasive materials in the slurries produce defects in the form of microscratches. Another concern is poor planarization efficiency, which is the ability of the slurry to polish high points preferentially over low points on the surface of the wafer. Microscratches and poor planarization efficiency result in integrated circuits with increased defects and a lower yield.

An object of this invention, therefore, is a CMP formulation for planarization of a wafer surface having copper deposited thereon, the formulation having a high copper removal rate, a comparatively low liner material removal rate, appropriate material selectivity ranges to minimize copper dishing at the onset of liner exposure, and good planarization efficiency.

SUMMARY OF THE INVENTION

The present invention relates to CMP compositions containing a rheology agent and to copper CMP using such compositions.

In one aspect, the invention relates to a CMP composition for planarization of copper containing films, in which the composition includes at least an abrasive and a rheology agent.

In a further aspect, the invention relates to a CMP composition for planarization of copper films, in which the composition includes at least an abrasive component, an oxidizing agent, and a rheology agent.

In a still further aspect, the present invention relates to a CMP formulation for use in the planarization of a copper containing wafer surface, wherein said formulation comprises first "1a" and second "1b" slurry compositions, said "1a" composition comprising:

| | |
|---|---|
| oxidizing agent | 0.1 to 30 wt. % |
| passivating agent | 0.01 to 10 wt. % |
| chelating agent | 0.1 to 25 wt. % and |

|   |   |
|---|---|
| rheology agent | 0.0 to 65 wt. % and |
| abrasive | 0.0 to 30 wt. % | and said "1b" composition comprising:

|   |   |
|---|---|
| oxidizing agent | 0.01 to 30 wt. % |
| passivating agent | 0.01 to 10 wt. % |
| chelating agent | 0.1 to 25 wt. % |
| rheology agent | 0.001 to 65 wt. % and |
| abrasive | 0.0 to 30 wt. %. |

Still another aspect of the invention relates to a method of polishing copper on a substrate having copper thereon, including contacting copper on the substrate under CMP conditions with a CMP composition effective for polishing the copper, wherein the CMP composition includes a rheology agent.

Other aspects, features and embodiments of the invention will be more fully apparent from the ensuing disclosure and appended claims.

BRIEF DESCRIPTION OF THE DRAWINGS

FIGS. 2a and 2b illustrate one affect of a rheology agent on laminar flow in a CMP process according to one embodiment of the present invention.

DETAILED DESCRIPTION OF THE INVENTION, AND PREFERRED EMBODIMENTS THEREOF

The present invention is based on the discovery that a rheology agent in a CMP slurry modifies the slurry's fluid dynamics, by reducing the fluid's vertical flow. Vertical flow is defined as the flow component perpendicular to the primary flow plane or wafer surface. The rheology agent improves the material selectivity of the CMP process while maintaining a high level of copper planarization and good uniformity.

In CMP slurries it is advantageous to independently control the relative polishing rates between the different materials of the pattern to be polished. For example, in copper polishing one will actually polish copper, liner or barrier materials such as tantalum and tantalum nitride as well as dielectrics such as $SiO_2$, SiN, FSG, capping layers and low-k dielectrics.

The present invention relates to a CMP composition for use in planarizing copper containing semiconductor wafer surfaces, and to CMP processes using such composition. The composition includes a rheology agent, which serves to increase selectivity between copper and liner without affecting the copper removal rate.

The present invention, in its broadest sense relates to a CMP composition for planarization of copper films, the CMP composition comprising at least an abrasive and a rheology agent.

Rheology[1] is the study of the change in form and flow of matter, and embraces elasticity, viscosity and plasticity. Viscosity is a measure of internal friction in a fluid, caused by intermolecular attraction, which makes the fluid resist a tendency to flow.

[1] More Solutions to Sticky Problems, Brookfield Engineering Labs., Inc., P. 13

Addition of a rheology agent to a CMP slurry composition provides a means by which to modify the slurry's viscosity and laminar fluid flow, which encompasses the movement of one layer of the slurry past another, with a reduced transfer of matter between layers.

Figure 1:
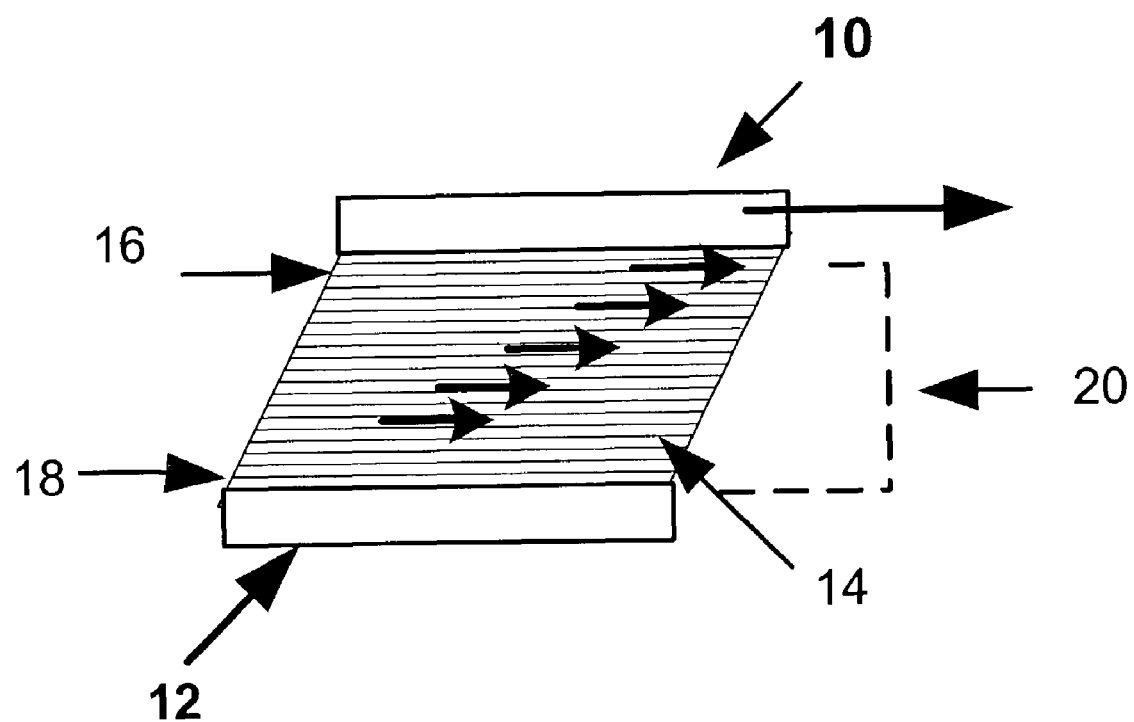
FIG. 1 shows a depiction of laminar flow consistent with the meaning of the term as used herein.

FIG. 1 shows a depiction of laminar flow consistent with the meaning of the term as used herein. When a fluid 14, such as a CMP slurry is bound by two opposing plates, whereby one plate 10, moves while the second plate 12, remains stationary, it is found that there is a layer or lamina of fluid (slurry) 16, which moves with the plate, and a layer closest to the stationary plate which remains essentially stationary 18. The fluid or slurry tends to move in layers with each layer having a successively higher speed that creates a gradient of velocity as you move from the stationary to the moving plate. The gradient of velocity, also referred to as shear rate or rate of strain, is defined as the velocity of top layer 16, with respect to the thickness of the film 20.

Rheology agents in CMP slurries can be used to control dishing and erosion phenomena during planarization of submicron features.

A pseudoplastic rheology agent introduces a flow behavior in which the viscosity of the slurry decreases as shear rate increases. During a CMP process shear rate is highest at elevated topography (protuberances and asperities), allowing for greater material removal through increased abrasive particle momentum and mechanical polishing. And, reactants are provided more readily by means of higher fluid flow to the low viscosity areas near the asperities. In the vias and line trenches, where the shear rate is lower, a localized higher viscosity reduces fluid velocities. Lower fluid velocities help to maintain the passivation layer by reducing reactant transport and mechanical abrasion caused by turbulent mixing.

A rheology agent that increases the viscosity and laminar flow advantageously decreases the vertical flow of the slurry. In terms of polishing, this causes abrasive particles to move almost exclusively in the direction of the flow plane of the lamina between the wafer surface and the polishing pad.

FIGS. 2a and 2b illustrate one effect of a rheology agent on laminar flow in a CMP process. In FIG. 2a, slurry-abrasive particles 20, flow freely in a three dimensional space between wafer 22, which includes copper features 24 and liner material 26, and polishing pad 28. FIG. 2b shows the CMP process as in FIG. 2a, modified by addition of a rheology agent to the CMP slurry. Abrasive particles 20, become constrained in the flow plane (laminas) between wafer 22 and pad 26, thereby reducing wear to the copper features, by improving selectivity between copper 24, and liner 26, without reducing the overall copper removal rate.

Preferably, the rheology agent used in the CMP composition of the present invention is compatible and stable when combined with other components in a slurry. Moreover, the rheology agent should be stable in a particular pH range and with a particular oxidizer. Preferred Rheology agents are soluble in the active slurry components and non-reactive with the wafer surface chemistry.

Useful rheology agents include but are not limited to cross-linked acrylic polymers and Water Soluble Polymers (WSPs). More particularly, useful rheology agents include Noveon's Carbopol® series of polymers (Cleveland OH.), modified cellulose derivatives, cellulose ethers, starch derivatives, pectin derivatives, polyacylamides; and aqueous dispersions thereof. In a preferred embodiment, the rheology agent most useful in the present invention is selected from the group consisting of hydroxypropylcellulose, hydroxyethylcellulose, both available commercially from Aqualon (Wilmington, Del.) and carboxymethylcellulose.

In slurry, the rheology agent increases the viscosity, and structures its laminar flow such that vertical fluid motion is reduced. In a preferred embodiment, the rheology agent used in the present invention is hydroxypropylcellulose having a molecular weight of in the range of 300,000 to 1,000,000 MW.

Rheology agents tend to be polymeric and therefore molecular weight requirements differ depending on the type of rheology agent. For a class of water soluble polymers molecular weights greater than 50,000 are preferred.

In one embodiment, the present invention relates to a CMP composition for use in planarizing a wafer surface, said composition comprising at least an abrasive, and a rheology agent, such that the rheology agent increases the viscosity and laminar flow of the CMP composition. Preferably, the rheology agent increases the viscosity of the CMP composition to between 1.5 cSt and 50 cST at 25° C. and more preferably to a range that is between 3.0 to 5.0 cSt.

In a further embodiment, the present invention relates to an aqueous CMP composition for planarization of a wafer surface having a copper layer deposited thereon, the copper layer having been deposited during a copper damascene processing step, wherein said composition comprises an abrasive component, an oxidizing agent, and a rheology agent having the following concentrations by weight based on the total weight of the composition:
from about 0 to 30 wt. % abrasive;
from about 0.01 to 30 wt. % oxidizing agent; and
from about 0.001 to 60 wt. % rheology agent.

In a still further embodiment, the present invention relates to an aqueous CMP composition for planarization of a wafer surface having a copper layer deposited thereon, the copper layer having been deposited during a copper damascene processing step, wherein said composition comprises an abrasive, oxidizing agent, chelating agent, inhibiting agent, and rheology agent having the following concentrations by weight based on the total weight of the composition:
from about 0 to 30 wt. % abrasive;
from about 0.01 to 30 wt. % oxidizing agent;
from about 0.1 to 25 wt. % chelating agent;
from about 0.001 to 10 wt. % rheology agent.

The abrasive component as used herein may be of any suitable type, including, without limitation, oxides, metal oxides, silicon nitrides, carbides, etc. Specific examples include silica, alumina, silicon carbide, silicon nitride, iron oxide, ceria, zirconium oxide, tin oxide, titanium dioxide, and mixtures of two or more of such components in suitable form, such as grains, granules, particles, or other divided form. Alternatively, the abrasive can include composite particles formed of two or more materials, e.g., NYACOL® alumina-coated colloidal silica (Nyacol Nano Technologies, Inc., Ashland, Mass.). Alumina is a preferred inorganic abrasive and can be employed in the form of boehmite or transitional δ, θ or γ phase alumina. Organic polymer particles, e.g., including thermoset and/or thermoplastic resin(s), can be utilized as abrasives. Useful resins in the broad practice of the present invention include epoxies, urethanes, polyesters, polyamides, polycarbonates, polyolefins, polyvinylchloride, polystyrenes, polyolefins, and (meth)acrylics. Mixtures of two or more organic polymer particles can be used as the abrasive medium, as well as particles comprising both inorganic and organic components. In a preferred embodiment, the abrasive component of the present invention includes alumina-coated colloidal silica.

The term oxidizing agent as used herein is defined as any substance which removes metal electrons and raises the atomic valence and includes but is not limited to hydrogen peroxide ($H_2O_2$), ferric nitrate ($Fe(NO_3)_3$), potassium iodate ($KIO_3$), potassium permanganate ($KMnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), tetramethylammonium chlorite (($N(CH_3)_4$)$ClO_2$), tetramethylammonium chlorate (($N(CH_3)_4$)$ClO_3$), tetramethylammonium iodate (($N(CH_3)_4$)$IO_3$), tetramethylammonium perborate (($N(CH_3)_4$)$BO_3$), tetramethylammonium perchlorate (($N(CH_3)_4$)$ClO_4$), tetramethylammonium periodate (($N(CH_3)_4$)$IO_4$), tetramethylammonium persulfate (($N(CH_3)_4$)$S_2O_8$), urea hydrogen peroxide (($CO(NH_2)_2$) $H_2O_2$). The preferred oxidizing agent for the CMP slurry composition of the instant invention is hydrogen peroxide.

Alternatively, the oxidizing agent may comprise an amine-N-oxide having the formula ($R^1R^2R^3N{\rightarrow}O$), wherein $R^1R^2R^3$ are independently selected from the group consisting of: H and $C_1$-$C_8$ alkyl. Specific examples of amine-N-oxides include but are not limited to 4-methylmorpholine N-oxide ($C_5H_{11}NO_2$) and pyridine-N-oxide ($C_5H_5NO$).

The term chelating agent as used in the present CMP composition is intended to mean any substance that in the presence of a water containing solution solubilizes or etches the oxidized copper material. Copper chelating agents useful in the present invention include but are not limited to inorganic acids (i.e. phosphoric acid) and organic acids, amines and amino acids (i.e. glycine, alanine, citric acid, acetic acid, maleic acid, oxalic acid, malonic acid, succinic acid, nitrilotriacetic acid, iminodiacetic acid, ethylenediamine, and EDTA). A preferred chelating agent is glycine. 21.

The term corrosion inhibitor as used herein, is intended to mean any substance that reacts with the fresh copper surface and/or oxidized copper thin film to passivate the copper layer and prevent excessive etching of the copper surface during CMP. Preferably, the CMP composition of the present invention has a static metal etch rate of less than 500 Å/min, more preferably less than 200 Å/min, and most preferably less than 50 Å/min.

The corrosion inhibitor component in the CMP composition of the invention may comprise one or more inhibitor components including for example, imidazole, aminotetrazole, benzotriazole, benzimidazole, amino, imino, carboxy, mercapto, nitro, alkyl, urea and thiourea compounds and derivatives, etc. Dicarboxylic acids such as oxalic acid, malonic acid, succinic acid, nitrilotriacetic acid, iminodiacetic acid, and combinations thereof are also useful corrosion inhibitors. Preferred inhibitors include tetrazoles and their derivatives. In a specific embodiment, the corrosion inhibitor is 5-aminotetrazole (ATA).

The pH of the present CMP compositions may be at any suitable value that is efficacious for the specific polishing operation employed. In one embodiment, the pH of the CMP composition can be in a range of from about 2 to about 11, more preferably in a range of from about 2 to about 7.0, and most preferably in a range of from about 3 to about 6.

The solvents employed in the CMP compositions of the invention can be single component solvents or multicomponent solvents, depending on the specific application. In one embodiment of the invention, the solvent in the CMP composition is water. In another embodiment, the solvent comprises an organic solvent, e.g., methanol, ethanol, propanol, butanol, ethylene glycol, propylene glycol, glycerin, etc. In yet another embodiment, the solvent comprises a water-alcohol solution. A wide variety of solvent types and specific solvent media can be employed in the general practice of the invention to provide a solvating/suspending medium in which the abrasive is dispersed and in which the other components are incorporated to provide a composition of appropriate character, e.g., of slurry form, for application to the platen of the CMP unit to provide a desired level of polishing of the copper on the wafer substrate.

Bases can be optionally employed for pH adjustment in compositions of the invention. Illustrative bases include, by way of example, potassium hydroxide, ammonium hydroxide and tetramethylammonium hydroxide (TMAH), tetraethylammonium hydroxide, trimethyl hydroxyethylammonium hydroxide, methyl tri (hydroxyethyl) ammonium hydroxide, tetra(hydroxyethyl)ammonium hydroxide, and benzyl trimethylammonium hydroxide.

Acids can also be optionally employed for pH adjustment and buffering in the CMP compositions of the invention. The acids used can be of any suitable type, including, by way of example, formic acid, acetic acid, propanoic acid, butanoic acid, pentanoic acid, isovaleric acid, hexanoic acid, heptanoic acid, octanoic acid, nonanoic acid, lactic acid, hydrochloric acid, nitric acid, phosphoric acid, sulfuric acid, hydrofluoric acid, malic acid, fumaric acid, malonic acid, glutaric acid, glycolic acid, salicylic acid, 1,2,3-benzenetricarboxylic acid, tartaric acid, gluconic acid, citric acid, phthalic acid, pyrocatechoic acid, pyrogallol carboxylic acid, gallic acid, tannic acid, and mixtures including two or more acids of the foregoing or other types.

Amines when present can be of any suitable type, including, by way of example, hydroxylamine, monoethanolamine, diethanolamine, triethanolamine, diethyleneglycolamine, N-hydroxylethylpiperazine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 4-(2-hydroxyethyl)morpholine, aminoethylpiperazine, and mixtures including two or more of the foregoing or other amine species.

Surfactants when optionally employed in the CMP compositions of the invention can be of any suitable type, including non-ionic, anionic, cationic, and amphoteric surfactants, and polyelectrolytes including, for example: salts of organic acids; alkane sulfates (e.g., sodium dodecyl sulfate); alkane sulfonates; substituted amine salts (e.g., cetylpyridium bromide); betaines; polyethylene oxide; polyvinyl alcohol; polyvinyl acetate; polyacrylic acid; polyvinyl pyrrolidone; polyethyleneinine; and esters of anhydrosorbitols, such as those commercially available under the trademarks Tween® and Span®, as well as mixtures including two or more of the foregoing or other surfactant species.

In one embodiment, the invention provides an aqueous-slurry, CMP composition useful for planarizing substrates having copper thereon, e.g., copper interconnects, metallization, device structural elements, etc., in which the composition includes $H_2O_2$, hydroxypropylcelluose, glycine, ATA, and abrasive, having the following composition ranges by weight, based on the total weight of the composition:

| | |
|---|---|
| ATA | 0.01 to 10 wt. % |
| $H_2O_2$ | 0.01 to 30 wt. % |
| Glycine | 0.1 to 25 wt. % |
| Hydroxypropylcellulose (1,000,000 MW) | 0.01 to 5 wt. % |
| Alumina coated silica composite abrasive | 0 to 30 wt. % |

In a further specific illustrative embodiment, the CMP composition comprises the following components by weight, based on the total weight of the composition:

| | |
|---|---|
| ATA | 0.01-10 wt. % |
| $H_2O_2$ | 0.01-30 wt. % |
| Glycine | 0.1-25 wt. % |
| Hydroxypropylcellulose (1,000,000 MW) | 0.01 to 5 wt. % |
| Abrasive | 0-30 wt. % |
| Water | 30-90 wt. % | with the total wt. % of all components in the composition totaling to 100 wt. %.

Based on a study conducted by M. Hariharaputhiran, J. Zhang, S. Ramarajan, J. J. Keleher, Yuzhuo Li, and S. V. Babu, all of Clarkson University[1], when both $Cu^{2+}$ and glycine are present in a CMP solution comprising $H_2O_2$, the $Cu^{2+}$ and glycine react to form a $[Cu^{2+}\text{-}(gly)_2]$ chelate, which catalyzes the dissociation reaction of $H_2O_2$ into $OH^-$ and .OH. The .OH having a higher oxidation potential than $H_2O_2$, accelerates the rate of oxidation of the copper surface and hence the polish rates of the copper substrate. At the point of liner exposure, copper availability is reduced to the surface area of the feature, and as a consequence, dishing into the copper features occurs and wafer surface planarity is lost.

[1] M. Hariharaputhiran, et al., "Hydroxyl Radical Formation in $H_2O_2$-Amino Acid Mixtures and Chemical Mechanical Polishing of Copper", Journal of The Electrochemical Society, 2000, 147 (10) 3820-3826

The present invention makes use of a rheology agent's functionality to impart characteristics to a CMP formulation that result in lowering the degree to which dishing occurs into copper features by modifying the formulation's viscosity and laminar fluid flow.

Accordingly, the present invention advantageously reduces the degree to which dishing into copper features occurs at the onset of liner exposure, by decreasing the wear to such features caused by turbulence and abrasive particles, while maintaining the mechanical copper removal rate.

As one alternative, the CMP formulation of the present invention may be modified so as to vary the concentration of oxidizer in the slurry composition at or just prior to the onset of liner exposure. As the rate of copper removal is a function of oxidizing agent concentration, reducing the concentration thereof, affects the degree to which dishing occurs at the time of liner exposure.

The reduction in oxidizing agent, may be accomplished, by switching of CMP formulations during planarization or in the case where oxidizing agent (i.e. $H_2O_2$) is combined in situ on the CMP tool's platen, by reducing the amount of oxidizing agent delivered to the platen. The latter method eliminates the need for two separate slurries.

Accordingly, the present invention, in a further embodiment, relates to a CMP formulation for use in the planarization of a copper containing wafer surface, wherein said formulation comprises first and second slurry compositions having varying material removal selectivities as a result of varying the concentration of an oxidizing agent component in the first and second compositions. Preferably the second composition is a chemical variant of the first whereby the removal selectivities of copper and liner materials are altered by reducing the concentration of the oxidizing agent component.

The first slurry composition, referred to as "1a", having a high concentration of oxidizing agent, removes bulk copper overburden at high removal rates, without causing liner exposure. Preferably, the "1a" composition removes copper at a rate that is between about 2,000 Å/min and 6,000 Å/min and more preferably at a rate that is between about 3,000 Å/min and 5,000 Å/min.

The second composition, referred to as "1b", having a significantly reduced oxidizing agent concentration as compared to composition "1a", removes and planarizes the remaining copper overburden and exposes the liner layer. As a result of lowering the concentration of oxidizing agent, the "1b" composition removes copper at a rate lower than that of formulation "1a". Preferably, the "1b" composition removes copper at a rate that is between about 500 Å/min and 3,000 Å/min and more preferably at a rate that is between about 1,000 Å/min and 2,000 Å/min.

In a further embodiment, the present invention relates to a "1b" slurry composition comprising a rheology agent and an oxidizing agent, wherein said oxidizing agent is present in a concentration that is less than a "1a" composition.

In a still further embodiment, the present invention relates to a CMP formulation for use in the planarization of a copper containing wafer surface, wherein said formulation comprises first "1a" and second "1b" slurry compositions, said "1a" composition comprising the following composition ranges by weight, based on the total weight of the composition:

| | |
|---|---|
| oxidizing agent | 0.1 to 30 wt. % |
| passivating agent | 0.01 to 10 wt. % |
| chelating agent | 0.1 to 25 wt. % and |
| abrasive | 0 to 30 wt. % | and said "1b" composition comprising the following composition ranges by weight, based on the total weight of the composition:

| | |
|---|---|
| oxidizing agent | 0.01 to 30 wt. % |
| passivating agent | 0.01 to 10 wt. % |
| chelating agent | 0.1 to 25 wt. % |
| Hydroxypropylcellulose (1,000,000 MW) | 0.01 to 5 wt. % and |
| abrasive | 0 to 30 wt. %. |

In a more preferred embodiment, the present invention relates to a CMP formulation for use in the planarization of a copper containing wafer surface, wherein said formulation comprises first "1a" and second "1b" slurry compositions, said "1a" composition comprising the following composition ranges by weight, based on the total weight of the composition:

| | |
|---|---|
| ATA | 0.01 to 10 wt. % |
| $H_2O_2$ | 0.1 to 30 wt. % |
| Glycine | 0.1 to 25 wt. % |
| Hydroxypropylcellulose (1,000,000 MW) | 0.01 to 5 wt. % and |
| Alumina coated silica composite abrasive | 0 to 30 wt. % | and said "1b" composition comprising the following composition ranges by weight, based on the total weight of the composition:

| | |
|---|---|
| ATA | 0.01 to 10 wt. % |
| $H_2O_2$ | 0.01 to 30 wt. % |
| Glycine | 0.1 to 25 wt. % |
| Hydroxypropylcellulose (1,000,000 MW) | 0.01 to 5 wt. % and |
| Alumina coated silica composite abrasive | 0 to 30 wt. % |

The CMP compositions of the invention can be readily formulated in a so-called 'day tank' or 'storage tank,' or the CMP composition can be provided as a two-part formulation or a multi-part formulation that is mixed at the point of use. The advantage of a multi-part formulation resides in its extended shelf life, relative to single-package formulations. A single package formulation is more susceptible to decomposition and change of its properties over time, in relation to a multi-part formulation, due to the presence of the oxidizer in the single-package CMP composition. The individual parts of the multi-part formulation can be mixed at the polishing table, polishing belt or the like, or in an appropriate container shortly before reaching the polishing table.

In one embodiment, each single ingredient of the CMP composition is individually delivered to the polishing table for combination at the table with the other ingredients of the formulation, to constitute the CMP composition for use. In another embodiment, the CMP composition is formulated as a two-part composition in which the first part comprises abrasive, corrosion inhibitor and rheology agent in aqueous medium, and the second part comprises oxidizing agent and chelating agent. In still another embodiment, the CMP composition is formulated as a two-part composition in which the first part comprises all components of the composition except the oxidizer, and the second part comprises the oxidizer. In all of these various embodiments, the mixing of ingredients or parts to form the final composition occurs at the point of use, with mixing at the polishing table, polishing belt or the like, or in an appropriate container shortly before reaching the polishing table.

The copper CMP composition of the invention can be utilized in a conventional manner in the CMP operation, by application of the CMP composition to the copper surface on the wafer substrate in a conventional fashion, and polishing of the copper surface can be carried out using a conventional polishing element such as a polishing pad, polishing belt, or the like.

The CMP composition of the invention is advantageously employed to polish surfaces of copper elements on semiconductor substrates, without the occurrence of dishing or liner or dielectric erosion.

CMP slurry compositions of the invention are highly effective for polishing copper on semiconductor wafer substrates, e.g., polishing of patterned copper wafers. The CMP compositions of the invention can be readily prepared by mixing of ingredients in the desired single-package or multi-part formulations, consistent with the foregoing discussion herein of single-package and multi-part formulations. The concentrations of the respective ingredients can be widely varied in specific formulations of the CMP composition, in the practice of the invention, and it will be appreciated that the CMP composition of the invention can variously and alternatively comprise, consist or consist essentially of any combination of ingredients consistent with the disclosure herein.

The features and advantages of the invention are more fully shown by the empirical examples and results discussed below.

EXAMPLES

Example 1

In one experiment 0.1% hydroxypropylcellulose with 1,000,000 MW was combined with:
4% glycine;
0.8% amino-tetrazole;
5% hydrogen peroxide; and
1% Nyacol DP6243 alumina coated silica composite abrasive.

The copper polish rate remained the same as without the addition of the rheology agent at approximately 4000 Å/min. However, tantalum (liner) polishing rate decreased from 40 Å/min to 30 Å/min, increasing selectivity from 100:1 to 133:1.

Example 2

Figure 3A:
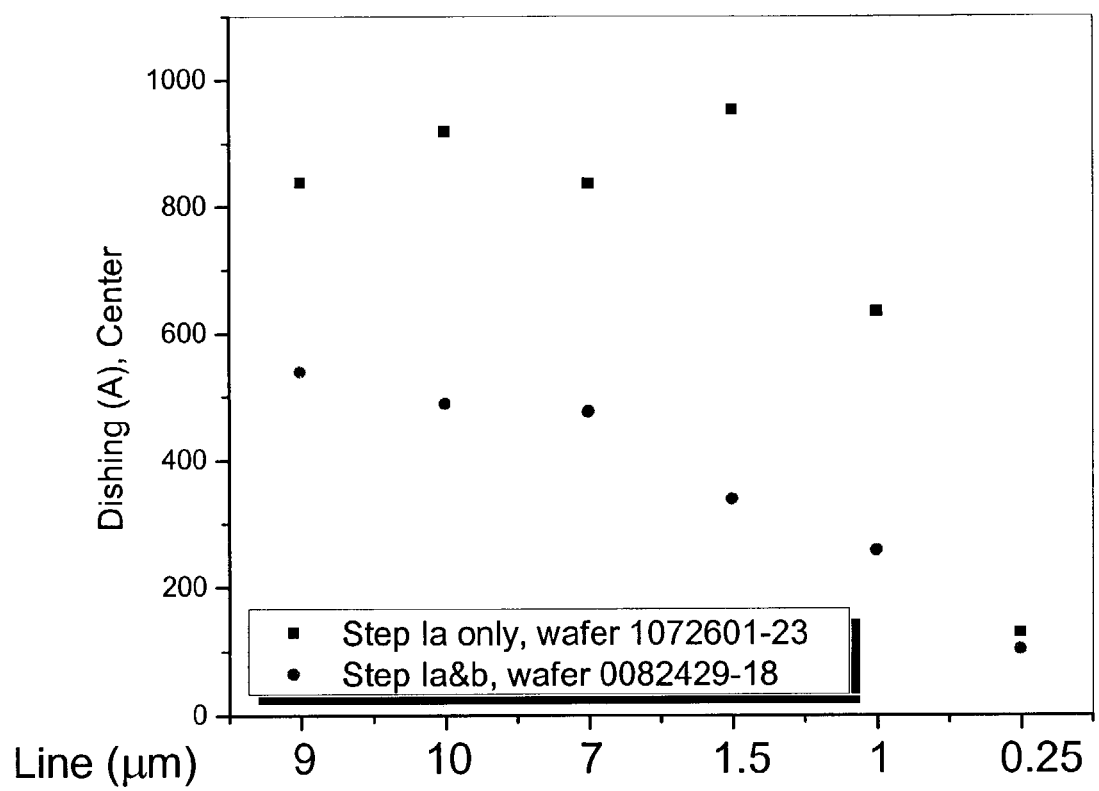
FIGS. 3a through 3c show a comparison of a step 1(a&b) CMP process (circles) relative to a step 1(a) only process according to one embodiment of the present invention.
Figure 3B:
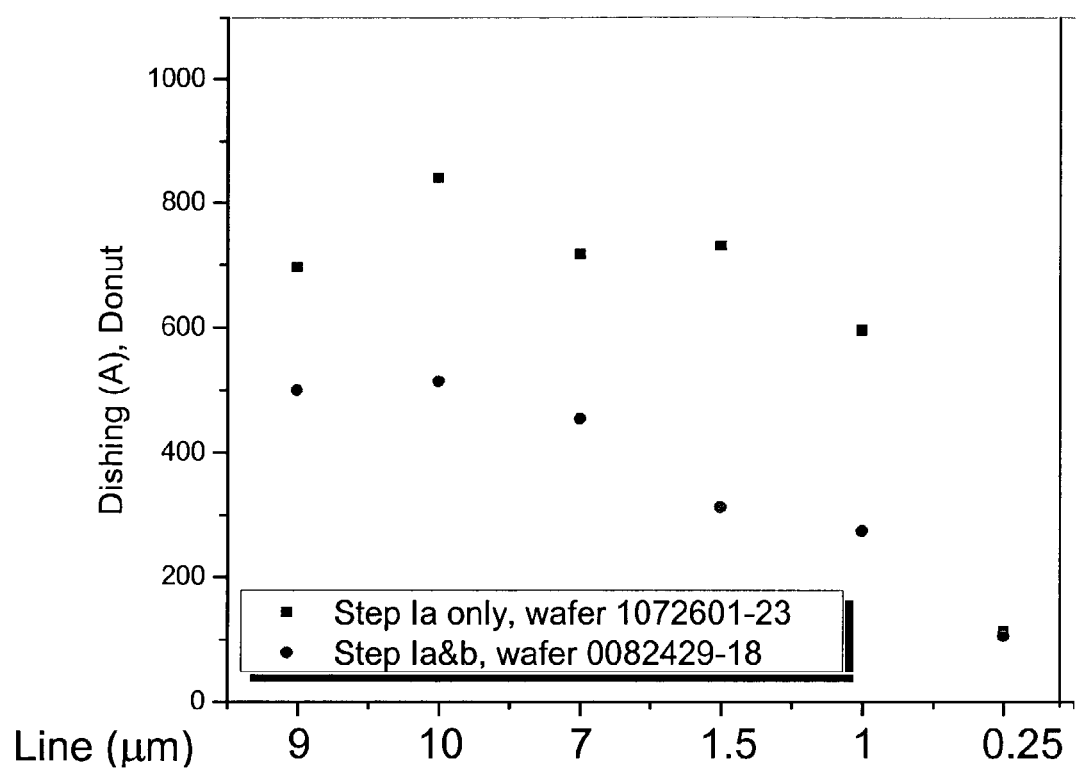
Figure 3C:
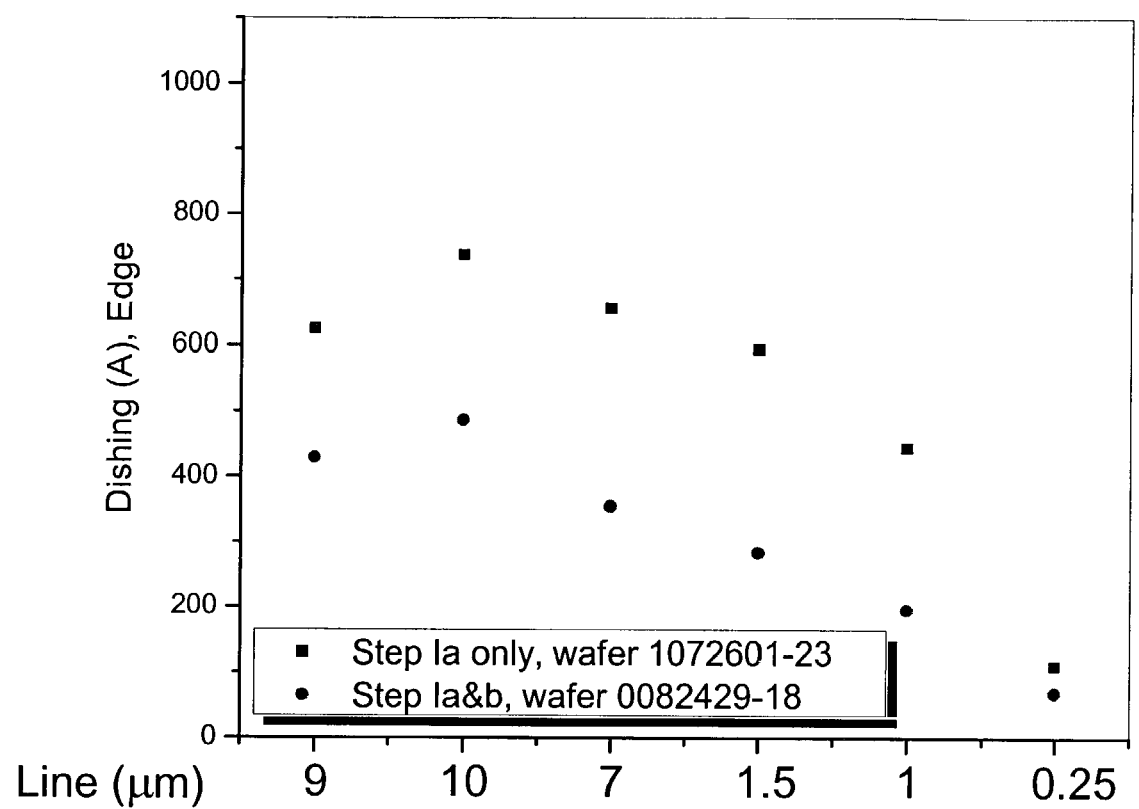

In a second experiment, the copper line dishing was compared between a one step copper polish using only the composition shown below under Step 1(a) and a two step (a&b) copper polish using the composition shown below under Step 1(a) and Step 1(b).
Step 1(a) Formulation
4% glycine;
0.8% amino-tetrazole;
5% hydrogen peroxide; and
1% alumina coated silica composite abrasive.
Step 1(b) Formulation
4% glycine;
0.8% amino-tetrazole;
0.4% hydrogen peroxide;
1% alumina coated silica composite abrasive.
0.1% hydroxypropylcellulose with 1,000,000 MW;

FIGS. 3a through 3c compare dishing data of a Step 1(a&b) CMP process (circles) relative to a Step 1(a) only process (squares) for different line widths (isolated lines). A decrease in the concentration of the oxidizing agent prior to liner exposure reduces dishing effects by more than 500 Å (see 1.5 μm line width). The data is taken for different die on the wafer. FIGS. 3a, 3b and 3c show dishing in the center die, donut (half radius) die and edge die, respectively.

Example 3

Figure 4:
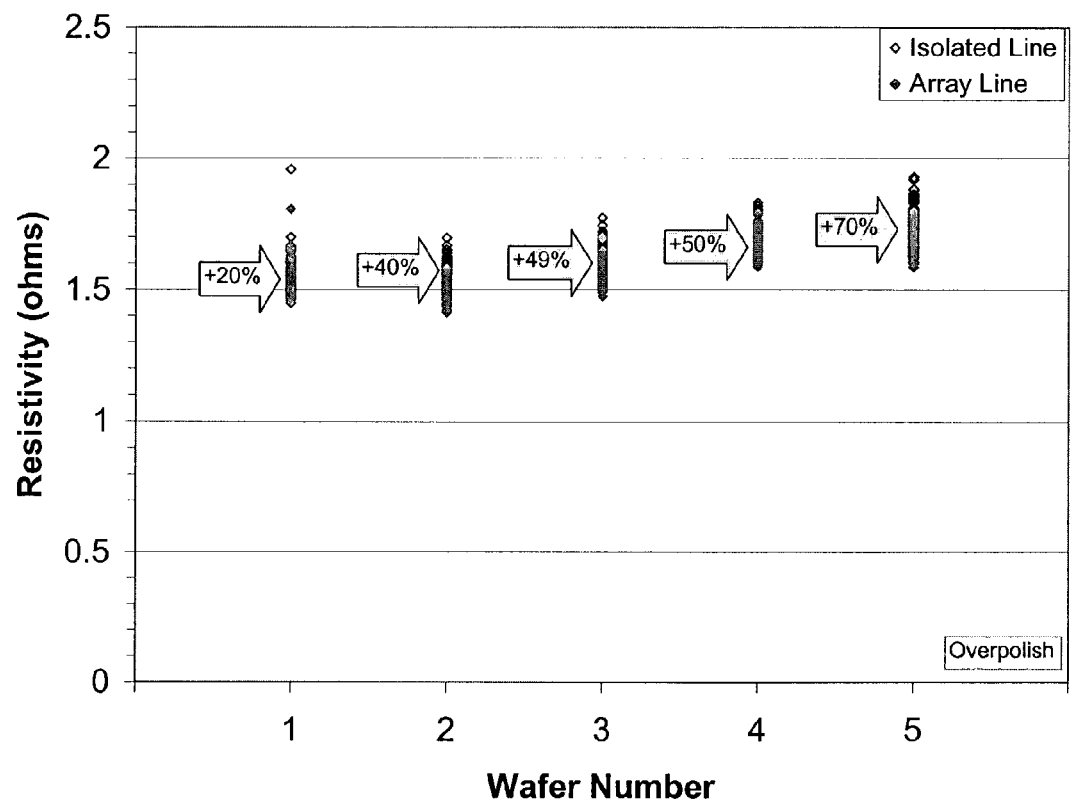
FIG. 4 shows electrical resistance data for 100 μm lines for different overpolishing times employing a step 1(a&b) slurry process.

FIG. 4 shows electrical resistivity data for different overpolishing times for 100 μm lines. As the overpolishing time increases, so too does line dishing, which results in a decreasing of the cross section of the line. A decrease in the area of the cross section increases the electrical resistivity of the line. The relative increase in the line resistivity stays small in comparison to the line resistivity even for long overpolishing times. Thus a robust process is achieved by utilizing the described step 1a and 1b slurry to remove the Cu overburden and planarize the wafer surface.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of planarizing a wafer substrate having copper films deposited thereon, said method comprising:
(a) contacting a copper layer with a first "1a" slurry composition to remove bulk copper, to yield a wafer substrate having remaining copper overburden thereon, said "1a" composition comprising the following composition ranges by weight, based on the total weight of the composition:

| | |
|---|---|
| oxidizing agent | 0.1 to 30 wt. % |
| passivating agent | 0.01 to 10 wt. % |
| chelating agent | 0.1 to 25 wt. % and |
| abrasive | 0 to 30 wt. % | wherein the "1a" composition is devoid of rheology agent; and
(b) contacting the remaining copper overburden with a second "1b" composition to remove the remaining copper overburden and expose an underlying liner layer, said "1b" composition comprising the following composition ranges by weight, based on the total weight of the composition:

| | |
|---|---|
| oxidizing agent | 0.01 to less than 30 wt. % |
| passivating agent | 0.01 to 10 wt. % |
| chelating agent | 0.1 to 25 wt. % and |
| abrasive | 0 to 30 wt. %, |
| rheology agent | 0.01 to 5 wt. % | wherein the amount of oxidizing agent in said "1b" composition is less than that of "1a" composition such that the "1b" composition removes copper at a rate lower than that of formulation "1a."

2. The method according to claim 1, wherein the second slurry composition has a pH in a range from about 2 to about 7.

3. The method according to claim 1, wherein said abrasive component is selected from the group consisting of: silica, alumina, silicon carbide, silicon nitride, iron oxide, ceria, zirconium oxide, tin oxide, titanium dioxide, and mixtures of two or more of such components.

4. The method according to claim 1, wherein said abrasive component is in form selected from the group consisting of: grains, granules, particles, and other divided forms.

5. The method according to claim 1, wherein said abrasive component comprises composite particles formed of two or more materials.

6. The method according to claim 1, wherein said abrasive component comprises an alumina-coated colloidal silica.

7. The method according to claim 1, wherein said abrasive component is selected from the group consisting of: organic polymer particles, epoxies, urethanes, polyesters, polyamides, polycarbonates, polyolefins, polyvinylchloride, polystyrenes, polyolefins, (meth)acrylics and mixtures of two or more of the foregoing.

8. The method according to claim 1, wherein said oxidizing agent is selected from the group consisting of: hydrogen peroxide ($H_2O_2$), ferric nitrate ($Fe(NO_3)_3$), potassium iodate ($KIO_3$), potassium permanganate ($KMnO_4$), nitric acid (HNO$_3$), ammonium chlorite (NH$_4$ClO$_2$), ammonium chlorate (NH$_4$ClO$_3$), ammonium iodate (NH$_4$IO$_3$), ammonium perborate (NH$_4$BO$_3$), ammonium perchlorate (NH$_4$ClO$_4$), ammonium periodate (NH$_4$IO$_3$), ammonium persulfate ((NH$_4$)$_2$S$_2$O$_8$), tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$) IO$_4$), tetramethylammonium persulfate ((N(CH$_3$)$_4$)S$_2$O$_8$), and urea hydrogen peroxide ((CO(NH$_2$)$_2$) H$_2$O$_2$).

9. The method according to claim 1, wherein said oxidizing agent is hydrogen peroxide.

10. The method according to claim 1, wherein said oxidizing agent comprises an amine-N-oxide having the formula (R$^1$R$^2$R$^3$N→O), wherein R$^1$R$^2$R$^3$ are independently selected from the group consisting of: H and C$_1$-C$_8$ alkyl.

11. The method according to claim 1, wherein said oxidizing agent is selected from the group consisting of: 4-methylmorpholine N-oxide (C$_5$H$_{11}$NO$_2$) and pyridine-N-oxide (C$_5$H$_5$NO).

12. The method according to claim 1, wherein said chelating agent is selected from the group consisting of: mineral acids, inorganic acids, organic acids, amines and amino acids.

13. The method according to claim 1 wherein said chelating agent is selected from the group consisting of: phosphoric acid, glycine, alanine, citric acid, acetic acid, maleic acid, oxalic acid, malonic acid, succinic acid, nitrilotriacetic acid, iminodiacetic acid, ethylenediamine, and EDTA.

14. The method according to claim 1 wherein the chelating agent in the second slurry composition is glycine.

15. The method according to claim 1 wherein said passivating agent in the second slurry composition is 5-aminotetrazole (ATA) or 5-aminotetrazole monohydrate.

16. The method of claim 1, wherein the rheology agent comprises hydroxypropylcellulose.

17. The method of claim 1, wherein the first slurry composition further comprises at least one solvent.

18. The method of claim 1, wherein the second slurry composition further comprises at least one solvent.

19. The method according to claim 18, wherein said solvent is selected from the group consisting of water, organic solvent and combinations thereof.

20. The method according to claim 18, wherein said solvent is selected from the group consisting of: water, methanol, ethanol, propanol, butanol, ethylene glycol, propylene glycol, glycerin, and combinations thereof.

21. The method of claim 1, wherein the second slurry composition has viscosity in a range from 1.5 cSt to 50 cSt at 25° C.

22. The method according to claim 21, wherein said viscosity decreases as shear rate increases.

23. The method of claim 1, wherein the rheology agent comprises cross-linked acrylic polymers or Water Soluble Polymers.

24. The method of claim 1, wherein the rheology agent comprises modified cellulose derivatives, cellulose ethers, starch derivatives, pectin derivatives, polyacylamides; and aqueous dispersions thereof.

25. The method of claim 1, wherein the rheology agent comprises hydroxypropylcellulose, hydroxyethylcellulose, and carboxymethylcellulose.

26. The method of claim 1, wherein the passivating agent comprises: tetrazole, imidazole, aminotetrazole, benzotriazole, benzimidazole, and derivatives thereof; oxalic acid malonic acid; succinic acid; nitrilotriacetic acid; iminodiacetic acid; and combinations thereof.

27. The method of claim 1, wherein the first slurry composition removes copper at a rate between about 2,000 Å/min and 6,000 Å/min.

28. The method of claim 1, wherein the second slurry composition removes copper at a rate that is between about 500 Å/min and 3,000 Å/min.

29. A method of planarizing a wafer substrate having copper films deposited thereon, said method comprising:

(a) contacting a copper layer with a first "1a" slurry composition to remove bulk copper, to yield a wafer substrate having remaining copper overburden thereon, said "1a" composition comprising the following composition ranges by weight, based on the total weight of the composition:

| | |
|---|---|
| oxidizing agent | 0.1 to 30 wt. % |
| passivating agent | 0.01 to 10 wt. % |
| chelating agent | 0.1 to 25 wt. % and |
| abrasive | 0 to 30 wt. % | wherein the "1a" composition is devoid of rheology agent; and (b) contacting the remaining copper overburden with a second "1b" composition to remove the remaining copper overburden and expose an underlying liner layer, said "1b" composition comprising the following composition ranges by weight, based on the total weight of the composition:

| | |
|---|---|
| oxidizing agent | 0.01 to less than 30 wt. % |
| passivating agent | 0.01 to 10 wt. % |
| chelating agent | 0.1 to 25 wt. % |
| Hydroxypropylcellulose (1,000,000 MW) | 0.01 to 5 wt. % and |
| abrasive | 0 to 30 wt. %, | wherein the amount of oxidizing agent in said "1b" composition is less than that of "1a" composition such that the "1b" composition removes copper at a rate lower than that of formulation "1a."

30. The method according to claim 1, wherein said first and second CMP compositions are formulated in a day tank or storage tank.

31. The method according to claim 1, wherein said first and second CMP compositions are two-part formulations or a multi-part formulations that are mixed at the point of use.

32. The method according to claim 1, wherein said first and second CMP compositions comprise single components individually delivered to a polishing table for combination at the table with the other ingredients of the formulation, to constitute the first and second CMP composition for use.

33. The method according to claim 1, wherein said second CMP composition is formulated as a two-part composition in which the first part comprises abrasive, inhibiting agent, and rheology agent in aqueous medium, and the second part comprises oxidizing agent and chelating agent.

34. The method according to claim 1, wherein said second CMP composition is formulated as a two-part composition, wherein said first part comprises all components of the composition except the oxidizing agent, and the second part comprises the oxidizing agent.

35. The method of claim 1, wherein the first and second CMP compositions further comprises copper residue from chemical mechanical polishing said wafer substrate.

36. The method of claim 1, wherein the second CMP composition further comprises copper residue and liner material residue from chemical mechanical polishing said wafer substrate.

37. The method of claim 1 wherein the second composition has a pH in a range from about 3 to 6.

38. The method according to claim 1, wherein the oxidizing of the second slurry composition comprises $H_2O_2$, the inhibiting agent of the second slurry composition comprises ATA, the chelating agent of the second slurry composition comprises glycine, the rheology agent of the second slurry composition comprises hydroxypropylcellulose, and the abrasive of the second slurry composition comprises alumina coated silica composite abrasive, having the following composition ranges by weight, based on the total weight of the composition:

| | |
|---|---|
| ATA | 0.01 to 10 wt. % |
| $H_2O_2$ | 1 to 30 wt. % |
| Glycine | 0.1 to 25 wt. % |
| Hydroxypropylcellulose | 0.1 to 5 wt. % |
| Alumina coated silica composite abrasive | up to 30 wt. % |

39. The method according to claim 1, wherein the oxidizing agent of the second slurry composition comprises $H_2O_2$, the inhibiting agent of the second slurry composition comprises ATA, the chelating agent of the second slurry composition comprises glycine, the rheology agent of the second slurry composition comprises hydroxypropylcellulose, and the abrasive of the second slurry composition comprises alumina coated silica composite abrasive, having the following composition ranges by weight, based on the total weight of the composition:

| | |
|---|---|
| ATA | 0.01-10 wt. % |
| $H_2O_2$ | 1-30 wt. % |
| Glycine | 0.1-25 wt. % |
| Hydroxypropylcellulose | 0.1 to 5 wt. % |
| Abrasive | up to 30 wt. % |
| Water | 30-90 wt. % | with the total wt. % of all components in the composition totaling to 100 wt. %.

40. The method of claim 1, wherein a selectivity between copper and tantalum when contacting with the second composition is in a range from 100:1 to 133:1 without affecting copper removal rates.

* * * * *

UNITED STATES PATENT AND TRADEMARK OFFICE
CERTIFICATE OF CORRECTION

PATENT NO. : 7,736,405 B2 Page 1 of 1
APPLICATION NO. : 10/436381
DATED : June 15, 2010
INVENTOR(S) : Karl Boggs, Michael Darsillo and Peter Wrschka It is certified that error appears in the above-identified patent and that said Letters Patent is hereby corrected as shown below:

On the title page, item (75) Inventors, please change the inventors to:

"Karl Boggs, Hopewell Jct., NY (US);
Michael Darsillo, Woodbury, CT (US);
Peter Wrschka, Danbury, CT (US)"

Signed and Sealed this

Third Day of August, 2010

David J. Kappos
*Director of the United States Patent and Trademark Office*